April 6, 1971 G. A. BROWN 3,574,010
FABRICATION OF METAL INSULATOR SEMICONDUCTOR
FIELD EFFECT TRANSISTORS
Filed Dec. 30, 1968 2 Sheets-Sheet 1

George A. Brown
Inventor

United States Patent Office 3,574,010

Patented Apr. 6, 1971

3,574,010

FABRICATION OF METAL INSULATOR SEMICONDUCTOR FIELD EFFECT TRANSISTORS

George A. Brown, Richardson, Tex., assignor to Texas Instruments Incorporated, Dallas, Tex.

Filed Dec. 30, 1968, Ser. No. 787,769
Int. Cl. H01l 7/34, 7/36
U.S. Cl. 148—187 8 Claims

ABSTRACT OF THE DISCLOSURE

A process of fabricating a MISFET in which a pair of spaced apart doped silicon dioxide bodies is formed on the surface of a silicon substrate. A layer of silicon nitride is formed over the surface of the bodies and the substrate and the portion of the layer in the space between the blocks is removed. A thin layer of the silicon substrate is then removed from the space between these bodies and a relatively thin silicon dioxide layer is formed on the silicon substrate in this space. A second layer of silicon nitride is then formed over the first silicon nitride layer and the silicon dioxide layer thereby to form a dielectrc region for the gate of the transistor. Thereafter source and drain regions are formed by diffusing impurities from the doped silicon blocks into underlying portions of the silicon substrate thereby forming source and drain regions, the silicon nitride layers preventing out-diffusion of the dopant from the doped bodies and the second silicon nitride layer covering any gaps between the silicon dioxide layer in the gate region between the silicon dioxide layer and the first silicon layer.

This invention relates to the fabrication of metal insulator semiconductor field effect transistors (MISFET's) and more particularly to the fabrication of self-registered MISFET's.

In the production of MISFET's, also known as insulated or isolated gate type field effect transistors, difficulties have been encountered in stabilizing the devices during processing operations and in forming high quality gate structures for the devices. Particularly, it has been difficult to fabricate such transistors which are free from contamination of alkali metal ions and the like.

Among the several objects of this invention may be noted the provision of methods for fabricating MISFET's in which high quality, stable devices are produced; the provision of such methods in which the channel regions are self-registered and the gate structure is maintained free of any significant contamination; and the provision of methods of the class described which are reliable and economical. Other objects and features will be in part apparent and in part pointed out hereinafter.

Briefly, the methods of the present invention include an initial step of forming a pair of spaced apart doped silicon dioxide bodies on the surface of a silicon substrate and then forming a layer of silicon nitride over the surfaces of the silicon dioxide bodies and the silicon substrate. The portion of the silicon nitride layer in the space between the silicon dioxide bodies is then removed and a thin layer of said silicon substrate from the space between the silicon dioxide bodies is thereafter removed. A thin silicon dioxide layer is formed on the silicon substrate in said space between the silicon dioxide bodies. A second layer of silicon nitride is formed over the first silicon nitride layer and this second layer extends over the silicon dioxide layer in the space between the silicon dioxide bodies thereby forming a dielectric region for the gate of said transistor. Source and drain regions for said transistor are formed by diffusing impurities from the doped silicon dioxide bodies into the portions of the silicon substrate underlying these bodies. The silicon nitride layers prevent out-diffusion of the dopant from the doped bodies and the second silicon nitride layer covers any gaps in the gate region between the silicon dioxide layer and the first silicon nitride layer.

The invention accordingly comprises the methods hereinafter described, the scope of the invention being indicated in the following claims.

In the accompanying drawings, in which one various possible embodiments of the invention is illustrated, FIG. 1 is a schematic or representational cross section of a silicon substrate on which is formed a layer of impurity-containing or doped silicon dioxide as formed in an initial step of the present invention;

Corresponding refernece characters indicate corresponding parts throughout the drawings.

Figure 1:
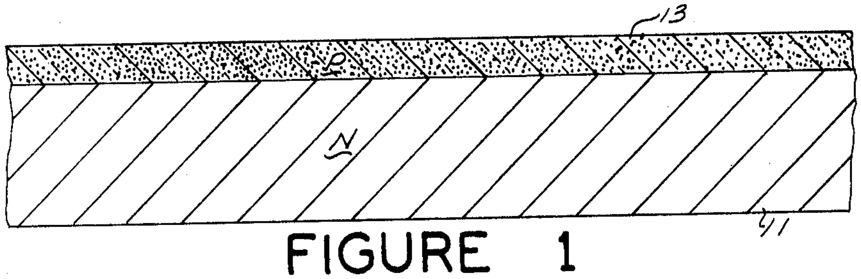

Referring now to the drawings, the starting material or substrate for fabricating MISFET's in accordance with this invention is a slice 11 for lightly doped n-type silicon (e.g., a concentration of about $10^{16}$ atoms/cm.$^3$) sawed from single crystal silicon about 3–5° off of 1-1-1 orientation. Other silicon substrates used in the fabrication of transistors and other devices are also useful as starting materials. A layer 13 of silicon dioxide, relatively heavily doped (e.g., a concentration in the order of $10^{19}$ or $10^{20}$ atoms/cm.$^3$) with a p-type impurity, such as boron, is formed on the substrate surface as shown in FIG. 1. An exemplary layer thickness is about 1 micron or so and this oxide film of layer may be formed by any of the customary processes, such as described in coassigned U.S. Pat. 3,341,381.

Figure 2:
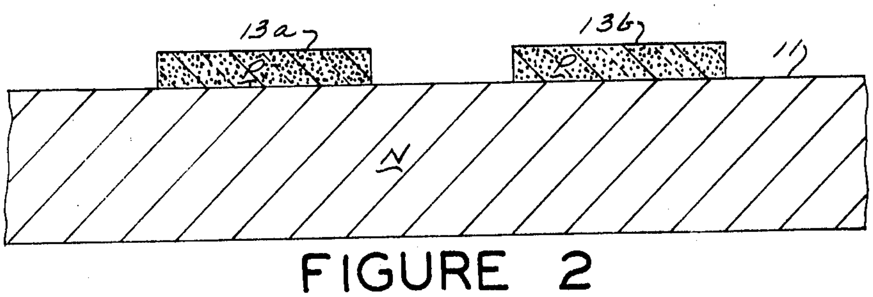
FIG. 2 shows the substrate after a masking and etching step to remove portions of the silicon dioxide layer and leave two spaced apart blocks of doped silicon dioxide.
Figure 3:
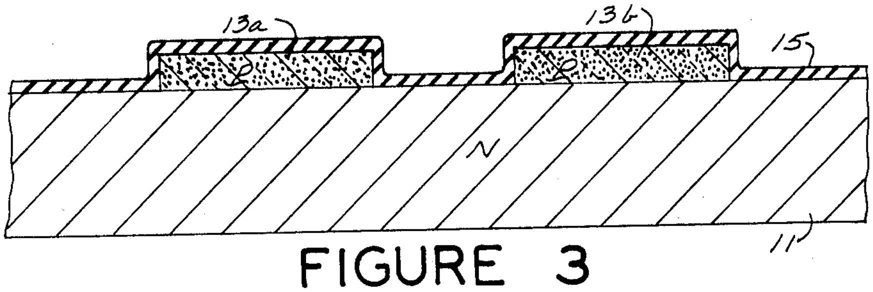
FIG. 3 illustrates a subsequent step in which a layer of silicon nitride is formed over the surfaces of the blocks and the substrate.

Following a conventional photoresist masking and etching (not shown) the silicon dioxide layer 13 is removed (by etching in buffered hydrofluoric acid, for example) except for areas 13*a* and 13*b* which constitute spaced apart blocks of p-doped silicon dioxide (FIG. 2). After washing with water or other customary solvents, a layer or film 15 of silicon nitride is thereafter formed to a typical thickness of about 1000° A. using conventional methods such as chemical vapor deposition from a gaseous mixture of silane and ammonia in hydrogen at a temperature of about 850° C. This silicon nitride coated structure illustrated in FIG. 3 is then selectively etched by an anodic etching process, such as described by Schmidt and Wonsidler, J. Electrochem. Soc. 114 #6, 603 (1967) and which employs an oxygen-bearing electrolyte, to remove the portion of the silicon nitride layer in the bottom of the space between the two blocks 13*a* and 13*b*. This exposes a channel surface of the silicon substrate 11 (FIG. 4) without removing the silicon nitride film on the opposing side or top surfaces of these blocks inasmuch as the silicon dioxide blocks under the silicon nitride layer act as dielectric anodization masks.

Figure 4:
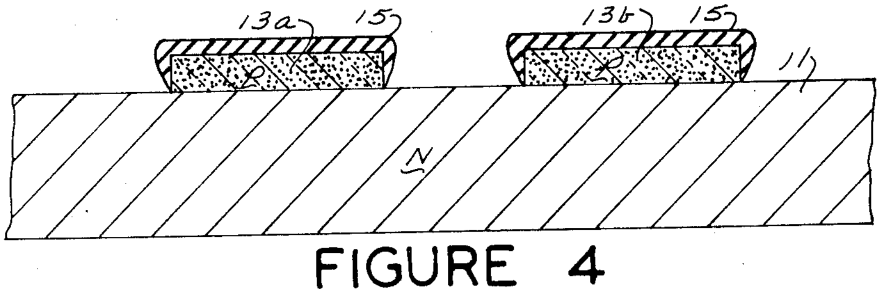
FIG. 4 shows the FIG. 3 structure after a selective etching step to remove that portion of the silicon nitride layer in the space between the two blocks.
Figure 5:
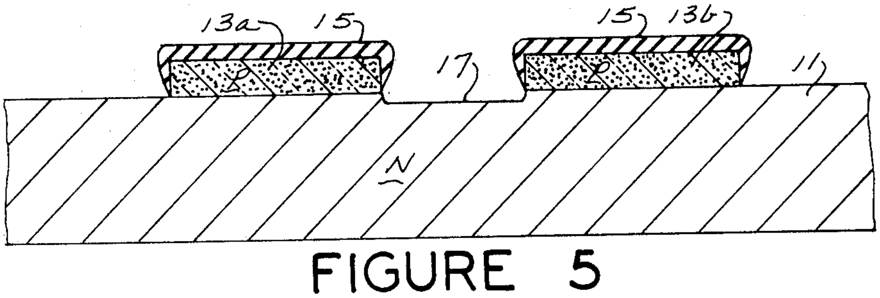
FIG. 5 illustrates a step of removing a thin layer of the silicon substrate from the space between the blocks.
Figure 6:
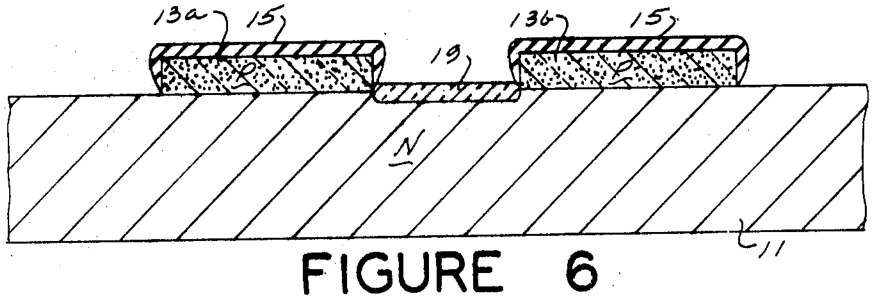
FIG. 6 shows the formation of a layer of silicon dioxide on the exposed silicon substrate in the space between the blocks.

The structure of FIG. 4 is then etched, preferably by vapor etching with hydrogen chloride in hydrogen, to remove any contaminated silicon in a channel area 17 and any contamination on the silicon nitride layer surface. A thin surface portion about a few hundred to a thousand A is thus removed. This nitride layer 15 maintains the surfaces of the blocks 13*a* and 13*b* sealed (FIG. 5) and prevents the hydrogen chloride etchant from undercutting or attacking the blocks 13*a* and 13*b*. The reactor being utilized for this processing is then purged with an inert gas, such as nitrogen or argon and a layer 19 of silicon dioxide is then formed (FIG. 6) in the channel area. Preferably this is done by heating the structure of FIG. 5 in an oxygen atmosphere for about ½ hour or so at a temperature of about 1000° C. to grow a thermal oxide to a depth of about 500 A. to 1000 A. This step is carried out in the same reactor tube in which the vapor etching was done so as to avoid contamination with damaging impurities, e.g., alkali metal ions, such as sodium, which in even trace amounts, can have a markedly deleterious effect on the characteristics and stability of the device being fabricated. While the structure of FIG. 6 is still in the reactor, the reactor is purged and the atmosphere is changed to a mixture of silane, ammonia and hydrogen at a temperature of about 850° C. A second layer of silicon nitride is deposited as indicated at reference character 21 in FIG. 7. This forms a smooth film over the silicon dioxide dielectric 19 in the channel area of the gate structure being formed. Thus any cracks or gaps between the abutting edges or interfaces between gate dielectric 19 and the silicon nitride layer 15 are covered and sealed thus avoiding possible future gate shorts in the device being fabricated. The reactor employed for the previous process steps may be either of the R.F. cold wall type or a hot wall reactor on the interior wall surfaces of which it is preferred that a silicion nitride layer has been built up during processing so as to seal the surfaces against migration of sodium ions and other contaminants from the reactor walls into the interior of the reactor.

Figures 7, 8:
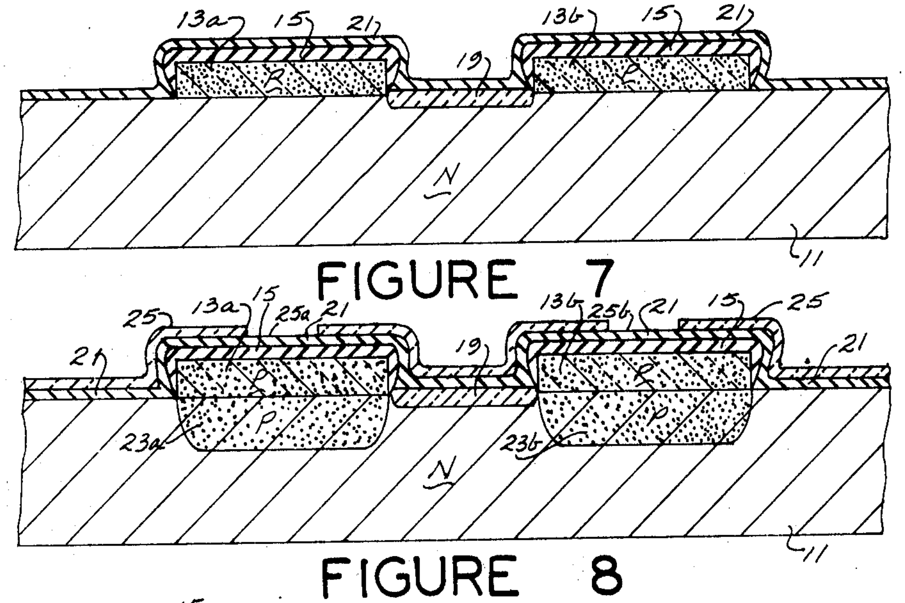
FIG. 7 illustrates the structure of FIG. 6 after forming a layer of silicon nitride thereover and a subsequent diffusion step.
FIG. 8 shows a further step in which a mask is formed on the structure of FIG. 7.

The resulting structure is then heated to about 1100° C. for about two hours to effect a diffusion of the p-type impurity in the doped blocks 13*a* and 13*b* into the silicon substrate areas underlying them, thus forming source and drain regions 23*a* and 23*b* as shown in FIG. 7. The depth of these regions is typically about 2–5 microns and layers 15 and 21 of silicon nitride function as a barrier or mask to prevent out-diffusion of the p-type impurity from the blocks 13*a* and 13*b* during this diffusion step. The registry of these source and drain regions relative to the gate region is thus assured inasmuch as the gate region is defined by the space between these blocks 13*a* and 13*b*.

Figure 9:
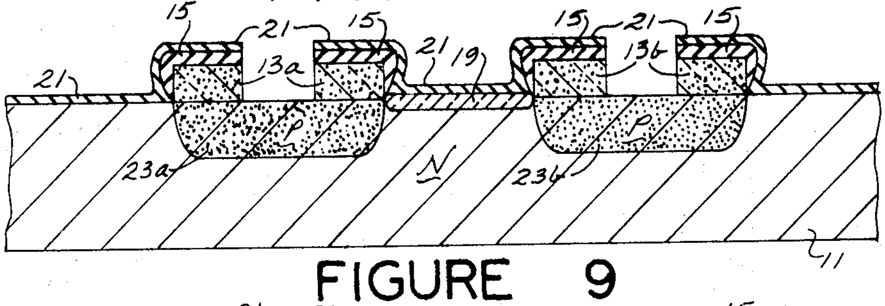
FIG. 9 illustrates an etching step.

An oxide coating or layer 25 is deposited over the entire surface of the silicon nitride layer by any of the conventional methods, such as by decomposition of a siloxane vapor. The layer thickness is typically about 1000–2000 A. Using customary photoresist masking and etching techniques, holes or windows 25*a* and 25*b* are formed (FIG. 8) in layer 25 and then the areas of the silicion nitride layers 15 and 21 underlying these windows are removed by etching with hot phosphoric acid, for example. Then using a customary silicon dioxide etchant, such as buffered hydrofluoric acid, and the windows cut in the silicon nitride as a mask, the central portions of the doped silicon dioxide blocks are removed to expose areas of the source and drain regions 23*a* and 23*b* of substrate 11 as shown in FIG. 9. Preferably, the photomask used to form windows 25*a* and 25*b* is stripped off so that the silicon dioxide mask layer 25 will be etched away during the etching of the doped oxide blocks. The silicon nitride serves as an etch stop in the gate area during this latter etching operation.

Alternatively, the exposure or opening up of the source and drain region surfaces may be accomplished without the use of multiple etching steps and the prior formation of the silicon dioxide layer 25. This may be done by the use of a single etchant solution, as described in copending, coassigned U.S. patent application S.N. 787,769, filed Dec. 30, 1968 (file 3340), wherein a mask resistant to this solution is formed on the surface of layer 21, the single etchant removing both the silicon nitride layer 21 and 15 sequentially and then the unmasked central area of the doped blocks 13*a* and 13*b*. As the formation or growth of the silicon oxide layer 19 in the channel region (FIG. 6) takes place in an oxidizing (wet or dry) ambient at about 1000° C. the surface of layer 15 may be converted to an extremely thin oxide film. If this does occur the use of the single etchant process is particularly useful because such an oxide film at the interface between layers 15 and 21 in the area under the window could cause a minor difficulty during use of hot phosphoric acid to remove both these nitride layers. This is, the etching action of hot phosphoric acid would tend to be stopped by such an oxide film which would have to be removed by an oxide etchant. The single etchant process which attacks both silicon nitride and silicon dioxide layers at about the same rate would not be affected by this oxide film.

Figure 10:
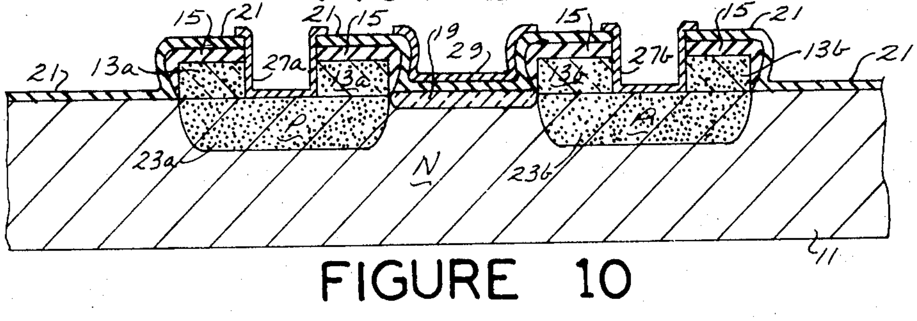
FIG. 10 shows the structure of FIG. 9 after metallization to form contacts for the source and drain regions and the gate of the transistor.

FIG. 10 illustrates the structure of FIG. 9 after conventional formation of conductive metal electrodes, viz., source contact 27*a*, drain contact 27*b* and the gate contact 29. The device of FIG. 10 is a p-channel MISFET. By simply using a lightly doped p-type silicon substrate as a starting material and forming the blocks 13*a* and 13*b* from silicon dioxide including an n-type impurity, an n-channel MISFET will result.

It is to be noted that the conventional optional step of forming a relatively thick (e.g., 1 or 2 microns) silicon dioxide layer over at least selected surface areas of the device, usually after metallizing to form the contacts, may be conveniently incorporated in this process. These thick oxides are useful to obtain desired capacitances under interconnecting leads, etc., formed during the customary final steps of integrated circuit fabrication.

The channel region underlying the gate dielectric, constituted by the silicon dioxide layer 19 and the overlying silicon nitride layer 21, is kept clean and free of any contaminants, such as sodium ions, by the process of the present invention and thus a high quality, stable MISFET is provided.

It will be understood that the thicknesses of the various layers as illustrated in the drawings are merely representative and are not relative or scaled inasmuch as the various actual layer thicknesses and substrate dimensions vary from only a few hundred A. to 10 mils or more and therefore cannot be shown to scale or even proportioned relative to each other.

It will be further understood that the diffusions will spread laterally as well as downwardly.

In view of the above, it will be seen that the several objects of the invention are achieved and other advantageous results attained.

As various changes could be made in the above methods without departing from the gist of the invention, it is intended that all matter contained in the above description or shown in the accompanying drawings shall be interpreted as illustrative.

What is claimed is:

1. In a process for fabricating a metal insulator semiconductor field effect transistor, the steps comprising:

forming a pair of spaced apart doped bodies on the surface of a semiconductor substrate;

forming a blocking layer over the surface of said doped bodies and said semiconductor substrate;

removing the portion of the blocking layer in the space between the doped bodies;

forming a thin dielectric layer on the semiconductor substrate in said space between the doped bodies;

forming a second blocking layer over the first blocking layer, said second layer extending over the dielectric layer in said space between the doped bodies thereby forming a dielectric region for the gate of said transistor; and forming source and drain regions for said transistor by diffusing impurities from said doped bodies into the portion of the semiconductor substrate underlying said bodies, said blocking layer preventing out-diffusion of the dopant from the doped bodies and the second blocking layers covering any gaps in said gate region between the dielectric layer and said first blocking layer.

2. In a process as set forth in claim 1, wherein said semiconductor substrate is a silicon substrate, said doped bodies are doped silicon dioxide bodies, said first and second blocking layers are silicon nitride and said dielectric layer is silicon dioxide and further wherein said steps of removing a thin layer of the semiconductor substrate forming said thin dielectric layer and forming said second blocking layer are all carried out sequentially in the same reactor without removal therefrom.

3. In a process as set forth in claim 2, said step of removing the portion of silicon nitride layer in the space between the silicon dioxide bodies comprising anodic etching.

4. In a process as set forth in claim 2, said step of removing the thin layer of said silicon substrate comprising vapor phase etching with hydrogen chloride.

5. In a process as set forth in claim 1, further subsequent steps comprising forming a patterned mask on the surface of said second silicon nitride layer to provide a window over a portion of each of said blocks, removing said first and second silicon nitride layers and the portion of the doped block under each of said windows thereby exposing a portion of source and drain regions and depositing a conductive metal on said exposed portions of the source and drain regions and over the second silicon nitride layer in said dielectric region thereby to form contacts for the source, drain and gate.

6. In a process as set forth in claim 5, the substrate being a relatively lightly doped n-type silicon, and the source and drain regions being relatively heavily doped with a p-type impurity whereby a p-channel MISFET is fabricated.

7. In a process as set forth in claim 5, the substrate being a relatively lightly doped p-type silicon, and the source and drain regions being relatively heavily doped with an n-type impurity whereby an n-channel MISFET is fabricated.

8. In a process for fabricating a metal insulator semiconductor field effect transistor, the steps comprising:

forming a pair of spaced apart doped silicon dioxide bodies ono the surface of a silicon substrate;

depositing a layer of silicon nitride over the surfaces of said silicon dioxide bodies and said silicon substrate;

removing the portion of the silicon nitride layer in the space between the silicon dioxide bodies by selective anodic etching;

removing a thin layer of said silicon substrate from the space between the silicon dioxide bodies by vapor phase etching with hydrogen chloride;

forming a thin silicon dioxide layer on the silicon substrate in said space between the silicon dioxide bodies by heating in an oxygen atmosphere;

forming a second layer of silicon nitride over the first silicon nitride layer, said second layer extending over the silicon dioxide layer in said space between the silicon dioxide bodies thereby forming a dielectric region for the gate of said transistor, this and the preceding steps of removing the thin layer of silicon substrate and forming the thin silicon dioxide layer all being carried out sequentially in the same reactor without removal therefrom;

forming source and drain regions for said transistor by diffusing impurities from said doped silicon dioxide bodies into the portions of the silicon substrate underlying said bodies, said silicon nitride layers preventing out-diffusion of the dopant from the doped bodies and the second silicon nitride layer covering any gaps in said gate region between the silicon dioxide layer and said first silicon nitride layer; and forming a patterned mask on the surface of said second silicon nitride layer to provide a window over a portion of each of said blocks, removing said first and second silicon nitride layers and the portion of the doped block under each of said windows thereby exposing a portion of source and drain regions and depositing a conductive metal on said exposed portions of the source and drain regions and over the second silicon nitride layer in said dielectric region thereby to form contacts for the source, drain and gate.

References Cited

UNITED STATES PATENTS 3,422,321 1/1969 Tombs ------------- 117—106

L. DEWAYNE RUTLEDGE, Primary Examiner

R. A. LESTER, Assistant Examiner

U.S. Cl. X.R.

29—571; 148—188; 317—235